(12) United States Patent
Miura et al.

(10) Patent No.: US 8,480,918 B2
(45) Date of Patent: Jul. 9, 2013

(54) PIEZOELECTRIC MATERIAL

(75) Inventors: Kaoru Miura, Matsudo (JP); Toshihiro Ifuku, Yokohama (JP); Kenichi Takeda, Yokohama (JP); Tetsuro Fukui, Yokohama (JP); Hiroshi Funakubo, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 756 days.

(21) Appl. No.: 12/135,980

(22) Filed: Jun. 9, 2008

(65) Prior Publication Data

US 2009/0026408 A1    Jan. 29, 2009

(30) Foreign Application Priority Data

Jun. 20, 2007    (JP) .................................. 2007-163031

(51) Int. Cl.
*B06B 1/06*    (2006.01)

(52) U.S. Cl.
USPC ...................................... 252/62.9 R; 501/134

(58) Field of Classification Search
USPC ........................ 252/62.9 R, 62.9 PZ; 501/134
See application file for complete search history.

(56) References Cited

U.S. PATENT DOCUMENTS

| 7,397,649 B2 * | 7/2008 | Muto et al. ................. 361/321.4 |
| 2008/0067898 A1 | 3/2008 | Aoki et al. |
| 2008/0089832 A1 | 4/2008 | Aoki et al. |
| 2009/0140605 A1 | 6/2009 | Shirakawa |

FOREIGN PATENT DOCUMENTS

| JP | 4-175223 A | 6/1992 |
| JP | 6-61017 | 3/1994 |
| JP | 63-288917 | 11/1998 |
| WO | 2006/025205 A1 | 3/2006 |
| WO | 2007/013598 A1 | 2/2007 |

OTHER PUBLICATIONS

European Search Report dated Jul. 19, 2012 in European Application No. 08158599.4.

Ralf-Peter Herber, et al., "Surface displacements and surface charges on Ba2CuWO6 and Ba2Cu0.5Zn0.5WO6 ceramics induced by local electric fields investigated with scanning-probe microscopy", Journal of Materials Research, U.S. Materials Research Society, vol. 2, No. 1. pp. 193-200, Jan. 2007.

* cited by examiner

*Primary Examiner* — Carol M Koslow

(74) *Attorney, Agent, or Firm* — Fitzpatrick, Cella, Harper and Scinto

(57) ABSTRACT

The present invention provides a piezoelectric material which can be applied even to the MEMS technique, exhibits satisfactory piezoelectricity even at high ambient temperatures and is environmentally clean, namely, a piezoelectric material including an oxide obtained by forming a solid solution composed of two perovskite oxides $A(1)B(1)O_3$ and $A(2)B(2)O_3$ different from each other in crystalline phase, the oxide being represented by the following general formula (1):

$$X\{A(1)B(1)O_3\}-(1-X)\{A(2)B(2)O_3\} \qquad (1)$$

wherein "A(1)" and "A(2)" are each an element including an alkali earth metal and may be the same or different from each other; "B(1)" and "B(2)" each include two or more metal elements, and either one of "B(1)" and "B(2)" contains Cu in a content of 3 atm % or more; and "X" satisfies the relation $0<X<1$.

3 Claims, 1 Drawing Sheet

PIEZOELECTRIC MATERIAL

BACKGROUND OF THE INVENTION

1. Field of the Invention

The present invention relates to a piezoelectric material having a new composition, in particular, a piezoelectric material that does not contain lead. Additionally, the present invention relates to a piezoelectric material that does not contain an alkaline metal bringing about disturbance in processing treatment when applied to the MEMS (Micro Electro Mechanical Systems) technique.

2. Description of the Related Art

Piezoelectric materials are widely used in applications such as actuators, ultrasonic vibrators, micro power supplies and high voltage generators. The piezoelectric materials used in these devices and apparatuses are perovskite structure materials referred to as PZT, and high both in Curie temperature and in piezoelectric property; however, such materials contain lead and hence exert a large environmental load. Accordingly, from the viewpoint of environmental issues, the development of non-lead piezoelectric materials that do not contain lead is being advanced.

Although as examples of the non-lead piezoelectric materials, a large number of piezoelectric materials containing alkaline metals such as $K_xNa_{(1-x)}NbO_3$ are known, such materials use alkaline metals and hence when alkaline metal-containing piezoelectric films are formed in micromachines such as MEMSs that use Si substrates, problems are caused in the micromachine production processes.

For example, in a case where a piezoelectric film is formed on a Si substrate, when a piezoelectric material is crystallized, the elements contained in the piezoelectric material are made to diffuse onto the Si substrate, and hence the rate of the etching processing of the Si substrate is changed to cause a problem in device fabrication. Additionally, flowing an alkaline metal-containing material in a process step results in a contamination by an alkaline metal to cause a similar production process-related problem.

Such alkaline metal-containing piezoelectric materials also have a problem of tending to undergo environmental degradation.

Ba-containing piezoelectric materials are among the piezoelectric materials that do not contain any alkaline metal and are additionally of non-lead type. For example, there has hitherto been known $BaTiO_3$ which is an $ABO_3$ type perovskite oxide and contains an alkaline earth metal as the A-site element. Although $BaTiO_3$ is extremely large in the piezoelectric property (electric field-induced distortion), the Curie temperature (Tc) thereof is as low as approximately 130° C., and hence is not sufficiently satisfactory as a material for devices such as piezoelectric actuators and ultrasonic vibrators required to have high Tc values.

Also likewise, $BaCu_{1/3}Nb_{2/3}O_3$ has hitherto been known as a Ba-containing piezoelectric material. This piezoelectric material has a Curie temperature as extremely high as approximately 520° C., but has an electric field-induced distortion representing the magnitude of the piezoelectric property as extremely low as 0.002%, and hence is not practical as a piezoelectric material ($BaCu_{1/3}Nb_{2/3}O_3$ has a c/a ratio of 1.031, and is a tetragonal crystal).

Although, as described above, piezoelectric materials large only in piezoelectric property or piezoelectric materials high only in Curie temperature have been known, materials large both in piezoelectric property and in Curie temperature have never been known except for lead-containing or alkaline metal-containing piezoelectric materials.

The development of materials, as materials similar to $BaTiO_3$, each having a high Curie temperature while maintaining the piezoelectric property has been attempted by combining various materials, but any of such developed materials is not sufficiently satisfactory. For example, Japanese Patent Application Laid-Open No. S63-288917 describes, as a material for condensers, $Ba(Zn, Ta)O_3$-$Ba(Zn, Nb)O_3$ obtained by forming a solid solution of two Ba-containing piezoelectric materials which are the same in crystalline phase; however, this material is too low in piezoelectric property to be suitable for practical applications.

Additionally, an attempt has been made to include Cu in a Ba-containing perovskite structure material, this material being not a piezoelectric material. Japanese Patent Application Laid-Open No. H06-61017 describes a material composed of $(Sr, Ba, Ca)(Ti, Nb, Cu)O_3$ as a varistor material prepared by including Cu in a Ba-containing perovskite structure material, with the Cu content thereof ranging from 0.01 atomic percent (atm. %) to 1 atm. %. However, when the material described in Japanese Patent Application Laid-Open No. H06-61017 is used as a piezoelectric material, Tc (Curie temperature) is lower than 130° C. and the piezoelectricity is lost in high-temperature environments. Additionally, when the Cu content in this material exceeds 2%, the dielectric loss of this material becomes too large to be qualified as a piezoelectric material.

As described above, piezoelectric materials in each of which both the Curie temperature and the piezoelectric property (electric field-induced distortion) are high have never hitherto been found except for lead-containing materials and alkaline metal-containing materials.

The present invention has been achieved in view of the above-described background art, and the problem to be solved by the present invention is to provide a piezoelectric material that can be applied even to the MEMS technique, exhibits satisfactory piezoelectricity even at high ambient temperatures and is environmentally clean.

SUMMARY OF THE INVENTION

Other features and advantages of the present invention will be apparent from the following description taken in conjunction with the accompanying drawings, in which like reference characters designate the same or similar parts throughout the figures thereof.

A piezoelectric material that solves the above-described problem is characterized by including an oxide obtained by forming a solid solution composed of two perovskite oxides $A(1)B(1)O_3$ and $A(2)B(2)O_3$ different from each other in crystalline phase, the oxide being represented by the following general formula (1):

$$X\{A(1)B(1)O_3\}-(1-X)\{A(2)B(2)O_3\} \quad (1)$$

(wherein "A(1)" and "A(2)" are each an element including alkaline earth metals and may be the same or different from each other; "B(1)" and "B(2)" each include two or more metal elements, and "B(1)" contains Cu in a content of 3 atm. % or more; and "X" satisfies the relation 0<X<1).

According to the present invention, there can be provided a piezoelectric material that can be applied even to the MEMS technique, exhibits satisfactory piezoelectricity even at high ambient temperatures and is environmentally clean.

Further features of the present invention will become apparent from the following description of exemplary embodiments with reference to the attached drawings.

DESCRIPTION OF THE EMBODIMENTS

Figure 1:
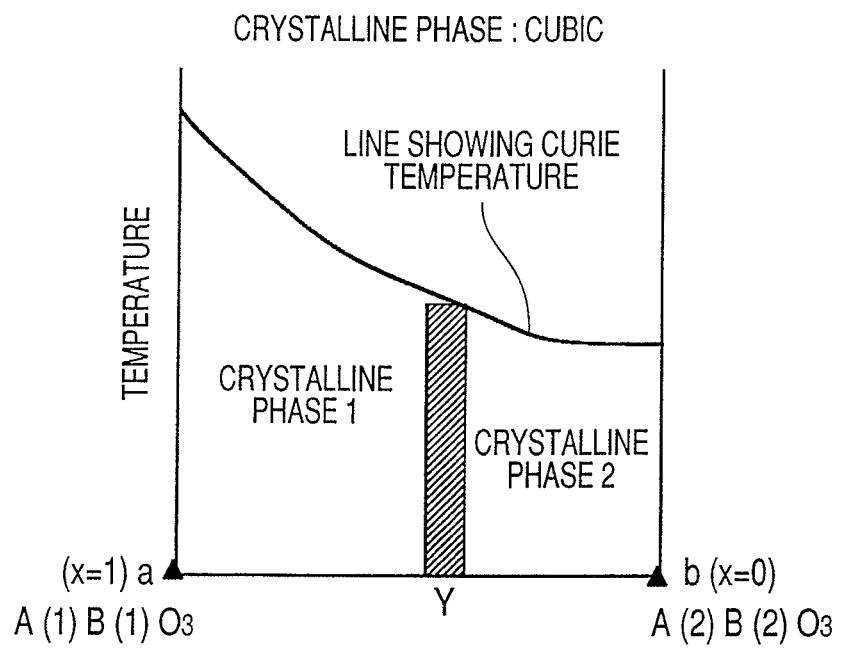
FIG. 1 is a schematic phase diagram illustrating the relations between a composition proportion X, crystalline phases and the temperature.

Preferred embodiments of the present invention will now be described in detail in accordance with the accompanying drawings.

Hereinafter, the present invention will be described in detail.

The piezoelectric material according to the present invention is characterized by including an oxide obtained by forming a solid solution composed of two perovskite oxides A(1)B(1)$O_3$ and A(2)B(2)$O_3$ different from each other in crystalline phase, the oxide being represented by the following general formula (1):

$$X\{A(1)B(1)O_3\}\text{-}(1\text{-}X)\{A(2)B(2)O_3\} \quad (1)$$

(wherein "A(1)" and "A(2)" are each an element including alkaline earth metals and may be the same or different from each other; "B(1)" and "B(2)" each include two or more metal elements, and "B(1)" contains Cu in a content of 3 atm. % or more; and "X" satisfies the relation 0<X<1).

As described above, it has hitherto been known that a piezoelectric material composed of a perovskite oxide constituted as represented according to a general formula $ABO_3$ is small in piezoelectric property but has a high Curie temperature wherein the A-site element is an alkaline earth metal element, the B-site element is composed of at least two elements including Cu, and examples of the piezoelectric material includes $BaCu_{1/3}Nb_{2/3}O_3$ that includes Cu in one-third the whole B-site elements. By including two or more elements in the B-sites, a large piezoelectric property can be expected.

The present inventors paid attention to the fact that such a piezoelectric material takes a tetragonal crystal structure having a large c/a ratio by including an element Cu in the B-sites, and hence by forming a solid solution composed of such a piezoelectric material and another piezoelectric material different in crystalline phase, a piezoelectric material having an MPB (morphotropic phase boundary, i.e., crystalline phase boundary) region can be formed easily. On the basis of this fact, the present inventors discovered that by regulating the Cu content, a piezoelectric material having a high piezoelectric property and a high Curie temperature can be obtained.

Examples of Cu-containing piezoelectric materials other than $Ba(Cu_{1/3}, Nb_{2/3})O_3$ may include $Ba(Cu_{1/2}, W_{1/2})O_3$, the ratio c/a thereof being 1.095. This is a material in which the Curie temperature exceeds 500° C.

Additional examples of such a piezoelectric material may include: $Ba(Cu_{1/3}, Ta_{2/3})O_3$, $Sr(Cu_{1/3}, Ta_{2/3})O_3$, $Sr(Cu_{1/3}, Nb_{2/3})O_3$, $Sr(Cu_{1/2}, W_{1/2})O_3$, $(Ba, Sr)(Cu_{1/3}, Ta_{2/3})O_3$ and $(Ba, Sr)(Cu_{1/3}, Nb_{2/3})O_3$. Any of these materials is low in the properties as a piezoelectric material in the same manner as in the above-described $Ba(Cu_{1/3}, Nb_{2/3})O_3$.

The Cu content is 3 atm. % or more, and preferably 6 atm. % or more. The upper limit of the Cu content is 50 atm. %. By setting the Cu content to be 6 atm. % or more, Tc is made to be 200° C. or higher, the crystalline phase becomes rich in a non-tetragonal crystalline phase such as a rhombohedral crystalline phase, the engineered domain effect is more readily exhibited and the piezoelectric property is improved.

Here, it is to be noted that, in the present invention, the atm. % value representing the Cu content is defined as the Cu occupation number proportion in relation to the total number of the metal atoms filling the whole B-sites.

For example, in a solid solution composed of $Ba(Cu_{1/3}, Nb_{2/3})O_3$ and $Ba(Mg_{1/3}, Nb_{2/3})O_3$, namely, $0.27\{Ba(Cu_{1/3}, Nb_{2/3})O_3\}\text{-}0.73\{Ba(Mg_{1/3}, Nb_{2/3})O_3\}$, the Cu occupation number proportion is calculated to be 0.27×⅓=0.09. In other words, the Cu content in this case is 9 atm. %.

Figure 2:
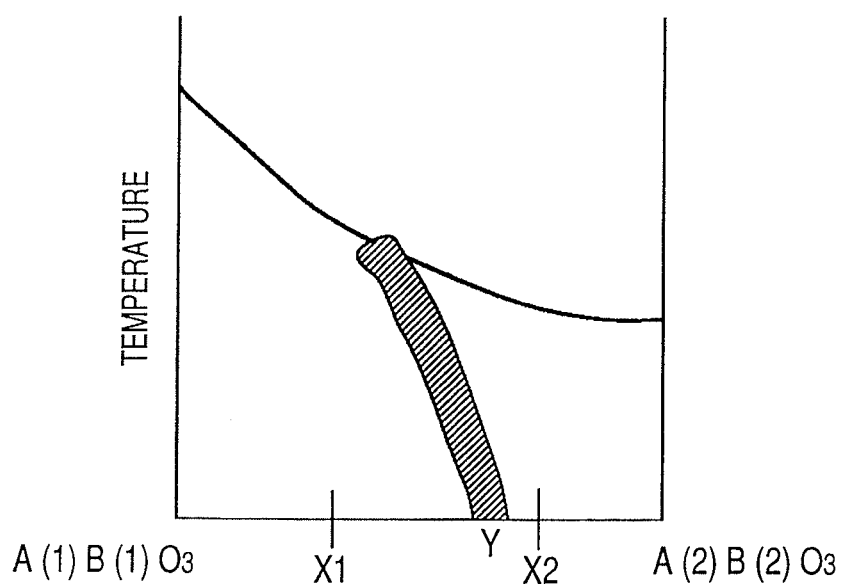
FIG. 2 is another schematic phase diagram illustrating the relations between a composition proportion X, crystalline phases and the temperature.

FIGS. 1 and 2 each illustrate the relation between the crystalline phase and the temperature for a piezoelectric material represented by a general formula:

$$X\{A(1)B(1)O_3\}\text{-}(1\text{-}X)\{A(2)B(2)O_3\}.$$

Description will be made on the relation between the above-described crystalline phase boundary (i.e., MPB) region represented by the shaded area Y and the composition proportion X associated with the two piezoelectric materials.

FIGS. 1 and 2 are each a schematic phase diagram illustrating the relations between the composition proportion X, crystalline phases and the temperature, wherein the ordinate represents the temperature, the abscissa represents the composition proportion associated with the two different piezoelectric materials. For example, in FIG. 1, the point a represents a piezoelectric material composed solely of A(1)B(1)$O_3$, and shows that the temperature at the point a is 0 K (Kelvin). The crystalline phase of this piezoelectric material is the crystalline phase 1, and when the temperature is increased from 0 K, the crystalline phase is transformed into a cubic phase at a certain temperature and the piezoelectric property is lost; this temperature is the Curie temperature (Tc). The composition proportion X is set at different values, and the crystalline phases and the Curie temperatures obtained for such composition proportions X are plotted to result in FIG. 1. Depending on the composition proportion X, the boundary region Y occurs in which the crystalline phase cannot be identified neither as the crystalline phase 1 nor as the crystalline phase 2. The material falling in the region represented by the shaded area Y is referred to as found in the MPB region and is extremely improved in piezoelectric property.

The material of the present invention has the MPB region composition region corresponding to the shaded area Y in each of FIGS. 1 and 2. Depending on the piezoelectric property required for a piezoelectric material, the piezoelectric material may have a composition falling outside the shaded Y region. In a case where a solid solution composed of two different piezoelectric materials is formed to result in such an MPB region as found to be inclined with respect to the temperature axis as illustrated by the phase diagram in FIG. 2, if a piezoelectric material is prepared so as to have a composition proportion somewhat away from the Y region with a high regard for satisfactory temperature properties, there can be obtained a piezoelectric material having piezoelectric property relatively stable with respect to temperature.

For example, when the temperature property of the MPB region is such that the MPB region stands up so as to be parallel to the temperature axis as illustrated in FIG. 1, materials having compositions falling in the vicinity of Y representing the composition of the MPB region may be used. However, as described above, when the MPB region is inclined with respect to the temperature axis as illustrated in FIG. 2, the compositions of the MPB region X1 and X2 located away from the composition Y are preferably used depending on the intended application fields. Here, X1 and X2 are the composition regions falling within the above-described range. Accordingly, in the case where the composition proportion $A(1)B(1)O_3/\{A(1)B(1)O_3+A(2)B(2)O_3\}$ in the crystalline phase boundary region is represented by Y, when $Y \leq 0.5$ and X=Z×Y (with the proviso that 0.5<Z<1.5), and when Y>0.5 and (1−X)=Z×(1−Y) (with the proviso that 0.5<Z<1.5), the piezoelectric material can acquire a high piezoelectric property as a piezoelectric material having a composition in the vicinity of the crystalline phase boundary region.

In each of FIGS. 1 and 2, the region of Y is represented as a broad region, because the composition of the MPB region is not defined by a strictly fixed composition, but has a certain composition width as the case may be. In the MPB region, the dielectric constant of the piezoelectric material is increased, and hence by measuring the dielectric constant, whether a solid solution composed of piezoelectric materials different in crystalline phase from each other is of an composition of the MPB region or not can be clarified. In the MPB region, the dielectric constant of the material is increased, and hence, by conducting an electrical measurement, the MPB region can be identified. In particular, as compared to the compositions at both ends, the dielectric constant of the MPB region is increased by a factor of two or more. The identification of the MPB composition in the present invention is conducted on the basis of the dielectric constant measurement as described above.

The piezoelectric material of the present invention is a piezoelectric material in which the $A(1)B(1)O_3$ is at least a tetragonal crystal. For the purpose of forming an MPB region having satisfactory properties, one of the two crystalline phases of the two piezoelectric materials is preferably a tetragonal crystal.

Further, the piezoelectric material of the present invention is characterized in that the $A(2)B(2)O_3$ other than a tetragonal crystal is at least one of a pseudocubic crystal, a rhombohedral crystal, an orthorhombic crystal and a monoclinic crystal; the $A(2)B(2)O_3$ is more preferably a pseudocubic crystal or a rhombohedral crystal.

Preferable as the A-site element are at least one of Ba and Sr. By using such an element, the volatility and the diffusivity at the time of sintering becomes low, and hence the composition control is facilitated when a thin film is formed or when a high temperature sintering is conducted; thus the use of such an element is appropriate to manufacturing. Additionally, a piezoelectric material composed of components low in volatility and diffusivity comes to be a material having a resistance to heat treatment involved in a step of the process for fabricating a device, and hence is preferable from the viewpoints of the stability and the reproducibility of the device properties.

Additionally, the element B(2) includes two or more elements selected from a divalent, a trivalent, a pentavalent and a hexavalent metal element. In particular, the element B(2) preferably includes at least one or more of divalent or trivalent Mg, Zn, Mn, Sc, Fe, In, Co and Ni. By using these elements, the improvement of the properties and the extension of the operating temperature range are achieved.

Additionally, the element B(1) includes Cu metal and one or more elements selected from pentavalent or hexavalent metal elements. By using these elements, the extension of the operating temperature range due to the improvement of the ferroelectricity and the increase of Tc is achieved.

It is to be noted that the elements B(1) and B(2) include element sets different in composition from each other, respectively, and preferably, the elements B(1) and (2) do not include elements such as alkaline metals, lead and Sb.

The piezoelectric material of the present invention may be a ceramic polycrystalline material, a preferentially oriented body having a specified orientation direction or a single crystal material. The shape of the piezoelectric material of the present invention may be any of a bulk body, a laminate and a thin film. When a thin film is formed, the thickness thereof is 0.5 μm or more, preferably 1.0 μm or more and more preferably 1.5 μm or more, for the purpose of ensuring an appropriate torque.

The orientation directions of the preferential orientation are orientations such as {100}, {110}, {111}, {211} and {221}, and are preferably {100}, {110} and {111}.

It is to be noted that, for example, {100} also means the orientations (100), (010) and (001) when the piezoelectric materials take crystalline structures other than the cubic crystal.

Examples of the piezoelectric materials of the present invention, each composed of an oxide obtained by forming a solid solution composed of $A(1)B(1)O_3$ and $A(2)B(2)O_3$ are presented below.

The piezoelectric materials described below list piezoelectric materials each obtained by forming a solid solution composed of piezoelectric materials different in crystalline phase from each other. Such a combination of two piezoelectric materials is characterized in that both of the piezoelectric materials contain an alkaline earth metal and either one of the piezoelectric materials contains Cu. It is to be noted that in the following list, presentation is restricted to combinations of $A(1)B(1)O_3$ and $A(2)B(2)O_3$ with omission of the X value in the general formula (1).

Examples of the above-described combinations (compositional formulas are presented on the left-hand and right-hand sides of a hyphen) include:

$Ba(Cu_{1/3},Nb_{2/3})O_3$-$Ba(Mg_{1/3},Nb_{2/3})O_3$,
$Ba(Cu_{1/3},Nb_{2/3})O_3$-$Ba(Zn_{1/3},Nb_{2/3})O_3$,
$Sr(Cu_{1/3},Nb_{2/3})O_3$-$Ba(Zn_{1/3},Nb_{2/3})O_3$,
$Sr(Cu_{1/3},Nb_{2/3})O_3$-$Ba(Mg_{1/3},Nb_{2/3})O_3$,
$Ba(Cu_{1/3},Ta_{2/3})O_3$-$Ba(Mg_{1/3},Nb_{2/3})O_3$,
$Sr(Cu_{1/2},W_{1/2})O_3$-$Ba(Mg_{1/3},Nb_{2/3})O_3$,
$Sr(Cu_{1/3},Ta_{2/3})O_3$-$Ba(Mg_{1/3},Nb_{2/3})O_3$,
$Ba(Cu_{1/3},Ta_{2/3})O_3$-$Ba(In_{1/2},Nb_{1/2})O_3$,
$Ba(Cu_{1/3},Nb_{2/3})O_3$-$Ba(Mn_{1/3},Nb_{2/3})O_3$,
$(Ba,Sr)(Cu_{1/3},Ta_{2/3})O_3$-$Ba(Mg_{1/3},Nb_{2/3})O_3$,
$(Ba,Sr)(Cu_{1/3},Nb_{2/3})O_3$-$Ba(Mg_{1/3},Nb_{2/3})O_3$,
$(Ba,Sr)(Cu_{1/3},Nb_{2/3})O_3$-$(Ba,Sr)(Mg_{1/3},Nb_{2/3})O_3$,
$Ba(Cu_{1/3},Nb_{2/3})O_3$-$Ba(Co_{1/2},W_{1/2})O_3$,
$Ba(Cu_{1/2},W_{1/2})O_3$-$Ba(Co_{1/2},W_{1/2})O_3$,
$Ba(Cu_{1/2},W_{1/2})O_3$-$Sr(Co_{1/2},W_{1/2})O_3$,
$Ba(Cu_{1/2},W_{1/2})O_3$-$Ba(Mn_{1/2},W_{1/2})O_3$,
$Ba(Cu_{1/3},Nb_{2/3})O_3$-$Ba(Mn_{1/2},W_{1/2})O_3$,
$Ba(Cu_{1/2},W_{1/2})O_3$-$Sr(Mn_{1/2},W_{1/2})O_3$,
$Ba(Cu_{1/3},Nb_{2/3})O_3$-$Ba(Ni_{1/3},Nb_{2/3})O_3$,
$Ba(Cu_{1/2},W_{1/2})O_3$-$Sr(Sc_{1/2},Ta_{1/2})O_3$,
$Ba(Cu_{1/3},Nb_{2/3})O_3$-$Ba(Zn_{1/3},Ta_{2/3})O_3$,
$Ba(Cu_{1/3},Nb_{2/3})O_3$-$Ba(Mg_{1/3},Nb_{2/3})O_3$-$BaTiO_3$,
$Ba(Cu_{1/3},Nb_{2/3})O_3$-$Ba(Zn_{1/3},Nb_{2/3})O_3$-$BaTiO_3$,
$Ba(Cu_{1/3},Nb_{2/3})O_3$-$Sr(Mg_{1/3},Nb_{2/3})O_3$-$BaTiO_3$.

In the above list, the piezoelectric materials presented on the left-hand side assume a tetragonal crystal structure, $BaTiO_3$ being also a tetragonal crystal, and the other piezoelectric materials each assume a crystal structure other than a tetragonal crystal structure. In the above-defined notation, for example, $Ba(Cu_{1/3},Nb_{2/3})O_3$-$Sr(Mg_{1/3},Nb_{2/3})O_3$-$BaTiO_3$ means that the elements Ba and Sr are included as the A-site elements and the elements Cu, Nb, Mg and Ti are included as the B-site elements. Accordingly, $Ba(Cu_{1/3},Nb_{2/3})O_3$-$Sr(Mg_{1/3},Nb_{2/3})O_3$-$BaTiO_3$ is recast in conformity with the general formula $X\{A(1)B(1)O_3\}$-$(1-X)\{A(2)B(2)O_3\}$ of the present invention to give an expression $X\{Ba(Cu,Nb,Ti)O_3\}$-$(1-X)\{Sr(Mg,Nb)O_3\}$.

Here, the number of the oxygen atoms is always presented to be 3, but it may be less than 3.0 depending on the conditions such as the baking conditions and the film forming conditions.

When the oxygen defects are increased, the coercive electric field of the material becomes large and no piezoelectricity at low electric fields comes to be exhibited. Accordingly, the number of oxygen atoms in the present invention is preferably 2.9 or more.

Additionally, to the above-described compositions, other types of metals may be added as dopants.

As described in following Examples, the content of the element Cu is required to be at least 3 atm. % or more, and otherwise no Curie temperature of 150° C. or higher can be ensured.

No particular constraint is imposed on the method for producing the piezoelectric material of the present invention, and conventional sintering methods may be used appropriately. Examples of such production methods include a powder metallurgical method in which two or more piezoelectric material powders are fully mixed together to prepare a mixture, and according to need, an additive such as a binder is added to the mixture, and then, the mixture is press-molded and sintered in a sintering furnace.

It is preferable to control the orientation by orientation control so as to fall in a predetermined direction.

The polarization direction is determined by the crystalline phase of the piezoelectric material; when a distortion is achieved by polarization displacement through applying an electric field along such a polarization direction, such an electric field direction is preferably the <001> direction in a tetragonal crystal and the <111> direction in a rhombohedral crystal; it is preferable to conduct the orientation control according to such directions. On the other hand, when the distortion is achieved by taking advantage of the engineered domain, the preferable directions are the <110> and <111> directions in a tetragonal crystal and the <001> direction in a rhombohedral crystal.

For that purpose, for example, the TGG (Templated Grain Growth) method is used. Additionally, when a thin film is formed by using the piezoelectric material of the present invention, examples of the usable formation techniques include sputtering film formation, sol-gel film formation and CVD film formation.

Examples of usable electrode materials involve a metal electrode and an oxide electrode. When a thin film is formed, the orientation of such an electrode is essential. For example, when an oriented film or an epitaxial film is formed on a Si (100) substrate, an oriented film or an epitaxial film made of YSZ, SrTiO$_3$ or MgO is disposed as a buffer layer, and further an orientation-controlled electrode layer is disposed thereon and then a film is formed.

The layer structure is, for example, SrRuO$_3$(100)/LaNiO$_3$(100)/CeO$_2$(100)/YSZ(100)/Si(100) in a case where the (100) orientation is adopted, and Pt(111)/YSZ(100)/Si(100) in a case where the (111) orientation is adopted.

Additionally, with the (110) orientation, the layer structure is SrRuO$_3$(110)/YSZ(100)/Si(100). In addition to the above-mentioned cases, when SrTiO$_3$ is used for the buffer layer, an orientation control can achieve the (100) orientation on the basis of a configuration of SrRuO$_3$(100)/SrTiO$_3$(100)/Si(100).

EXAMPLES

Hereinafter, the present invention will be described more specifically with reference to Examples.

Example 1

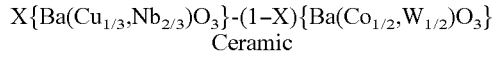
Ceramic (An example of B(1)=Cu, Nb; B(2)=Co, W)

Barium nitrate as the raw material for Ba, copper nitrate as the raw material for copper and niobium oxide (Nb$_2$O$_5$) as the raw material for niobium were prepared in a molar ratio of 3:1.2:1, and were suspended and dissolved under heating in an acidic aqueous solution, then the obtained solution was treated with alkaline to obtain a precipitate, and the precipitate was filtered off, collected and dried to prepare a raw material for Ba(Cu$_{1/3}$,Nb$_{2/3}$)O$_3$.

Additionally, in a separate preparation, cobalt nitrate as the raw material for Co and ammonium tungstate hydrate as the raw material for W were used in addition to barium nitrate. These compounds were suspended and dissolved under heating in an acidic aqueous solution in a molar ratio of 2:1:0.086. The obtained solution was made alkaline to obtain a precipitate, and the precipitate was filtered off, collected and dried to prepare a raw material for Ba(Co$_{1/2}$, W$_{1/2}$)O$_3$.

These two raw materials were mixed in various molar ratios (within a range of X=0.05 to 0.95), and the mixtures thus obtained were each milled with a ball mill and heat treated in air at 1100° C. The above range corresponds to a range from 1.66 atm. % to 31.6 atm. % in terms of the Cu content.

Thereafter, the milled mixture was molded with a press molding machine, and sintered by a sintering treatment at 1250° C. for 10 hours. The obtained sintered body was subjected to a polishing treatment, attached with electrodes, thereafter subjected to a polarization treatment at an electric field strength of 5 kV/cm to yield the piezoelectric material of the present invention. The obtained piezoelectric material was machined into a cantilever type specimen having a size of 12×3×1 mm$^3$, and the displacement magnitude of the specimen was measured against the driving voltage by means of a laser Doppler method.

Consequently, the electric field-induced distortions all exceed 0.015% (maximum was 0.030%). In a durability test in which the driving voltage (50 V) was repeatedly applied at a high temperature and a high humidity (60° C., 90% RH) and displacement was repeated 10$^8$ times, the displacement magnitude degradation was 2% or less.

The piezoelectric material of the present invention did not contain any alkaline metal, and hence the reproducibility of the composition control was easily achieved, and it was verified that the piezoelectric material of the present invention is small in the durability degradation at high temperature and high humidity. When the Cu content was 3 atm. % or more, the Curie temperature of the piezoelectric material of the present invention was found to be 150° C. or higher (maximum value was 300° C.) and the piezoelectric property of the piezoelectric material of the present invention was also satisfactory.

In the MPB region where X was 0.36, Tc was found to be 270° C. The dielectric constant of this piezoelectric material was found to be 1100.

These properties are shown in Table 1.

Example 2

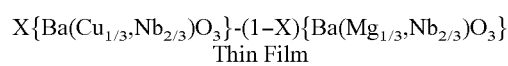
Thin Film (An example of B(1)=Cu, Nb; B(2)=Mg, Nb)

Barium carbonate, copper oxide, magnesium oxide and niobium oxide were mixed together, and the obtained mixture was subjected to a heated press molding to prepare a compacted powder target. By sputtering with the target, a film was formed on a Si (100) substrate with a SrRuO$_3$ (100) epitaxial film disposed thereon. In film forming, the substrate was heated at 750° C., and a film was formed by sputtering in a 2-Pa atmosphere of an Ar—O$_2$ mixed gas (Ar/O$_2$=10:1). Thus a perovskite {100} epitaxial piezoelectric film was obtained which was composed of Ba, Cu, Nb and Mg and had a content of Cu as the B-site element of 7 atm. % or more. On this film, a film of Au was formed as an upper electrode and the properties of the epitaxial piezoelectric film were evaluated. The composition of the MPB region Y was 0.18, and satisfactory piezoelectric property was able to be measured in a range of X values from 0.09 to 0.27 (3 atm. % to 9 atm. % in terms of the Cu content). The dielectric constant of each of these piezoelectric films was 330. The properties are shown in Table 1.

TABLE 1

| | Electric field-induced distortion | Variation magnitude degradation at $10^8$ cycles of displacements (60° C., 90% RH) | Curie temperature Tc (° C.) |
|---|---|---|---|
| BCN single material | Less than 0.002% | 10% or more | 520° C. |
| Example 1, BCN-BCoW (Cu: 1.6 atm % to 31 atm %) | 0.015% to 0.03% | 2% or less | 150 to 300° C. |
| Example 2, BCN-BMN (Cu: 3 atm % to 9 atm %) | 0.02% | 2.5% or less | 150 to 240° C. |

(Note) BCN single material in Table 1 represents the conventional $BaCu_{1/3}Nb_{2/3}O_3$ material.

The piezoelectric material of the present invention can be applied even to the MEMS technique, exhibits satisfactory piezoelectricity even at high ambient temperatures and is environmentally clean, and hence can be used, without causing any problems, for apparatuses and devices, such as ultrasonic motors and piezoelectric elements using a lot of piezoelectric materials.

The present invention is not limited to the above embodiments and various changes and modifications can be made within the spirit and scope of the present invention. Therefore to apprise the public of the scope of the present invention, the following claims are made.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Laid-Open No. 2007-163031, filed Jun. 20, 2007, which is hereby incorporated by reference herein in its entirety.

What is claimed is:

1. A piezoelectric material comprising an oxide represented by the following general formula (1):

$$X\{A(1)B(1)O_3\}-(1-X)\{A(2)B(2)O_3\} \qquad (1)$$

wherein the oxide is obtained by forming a solid solution of two perovskite oxides $A(1)B(1)O_3$ and $A(2)B(2)O_3$ different from each other in crystalline phase;

wherein $A(1)B(1)O_3$ is a tetragonal crystal, and $A(2)B(2)O_3$ is at least one of a pseudocubic crystal, a rhombohedral crystal, an orthorhombic crystal, and a monoclinic crystal, and wherein A(1) and A(2) each contains Ba and an element selected from alkaline-earth metals; B(1) contains Cu and Nb and one or more elements selected from pentavalent or hexavalent metal elements; B(2) contains Mg or Co and two or more elements selected from divalent, trivalent, tetravalent, pentavalent, and hexavalent metal elements; B(1) or B(2) contains Cu in a content of 3 atm % or more and 31 atm % or less; and X satisfies the relation 0<X<1.

2. The piezoelectric material according to claim 1, wherein the piezoelectric material has a crystalline phase boundary region.

3. A piezoelectric element using the piezoelectric material according to claim 1.

* * * * *